US007789647B2

(12) United States Patent
Kawakami et al.

(10) Patent No.: US 7,789,647 B2
(45) Date of Patent: Sep. 7, 2010

(54) PROCESSING APPARATUS AND METHOD

(75) Inventors: Eigo Kawakami, Utsunomiya (JP); Hirohisa Ota, Kawagoe (JP); Takashi Nakamura, Tokyo (JP); Kazuyuki Kasumi, Utsunomiya (JP); Toshinobu Tokita, Yokohama (JP)

(73) Assignee: Canon Kabushiki Kaisha (JP)

( * ) Notice: Subject to any disclaimer, the term of this patent is extended or adjusted under 35 U.S.C. 154(b) by 939 days.

(21) Appl. No.: 11/149,046

(22) Filed: Jun. 8, 2005

(65) Prior Publication Data

US 2005/0275125 A1 Dec. 15, 2005

(30) Foreign Application Priority Data

Jun. 11, 2004 (JP) ............... 2004-173317

(51) Int. Cl.
*B28B 17/00* (2006.01)
*B29C 35/08* (2006.01)
*B29C 59/00* (2006.01)

(52) U.S. Cl. ............... 425/149; 425/385; 425/174.4; 425/387.1; 425/389

(58) Field of Classification Search ............... 425/385, 425/174.4, 387.1, 389, 149; 264/293
See application file for complete search history.

(56) References Cited

U.S. PATENT DOCUMENTS

| | | | | |
|---|---|---|---|---|
| 5,804,017 A * | 9/1998 | Hector | ............... | 156/242 |
| 6,482,742 B1 * | 11/2002 | Chou | ............... | 438/690 |
| 6,696,220 B2 * | 2/2004 | Bailey et al. | ............... | 425/385 |
| 6,805,054 B1 * | 10/2004 | Meissl et al. | ............... | 101/483 |
| 6,842,229 B2 | 1/2005 | Sreenivasan et al. | | |
| 7,168,939 B2 * | 1/2007 | Bietsch et al. | ............... | 425/385 |
| 2003/0159608 A1 * | 8/2003 | Heidari | ............... | 101/494 |
| 2004/0046288 A1 | 3/2004 | Chou | | |
| 2004/0189996 A1 | 9/2004 | Sreenivasan et al. | | |
| 2004/0219461 A1 * | 11/2004 | Chung et al. | ............... | 430/311 |
| 2005/0184436 A1 * | 8/2005 | Jeong et al. | ............... | 264/496 |
| 2005/0186304 A1 * | 8/2005 | Seki | ............... | 425/416 |
| 2006/0001194 A1 * | 1/2006 | Cherala et al. | ............... | 264/320 |

FOREIGN PATENT DOCUMENTS

| | | |
|---|---|---|
| WO | 01/33300 A2 | 5/2001 |
| WO | WO 02/07199 | 1/2002 |
| WO | WO 02/08835 | 1/2002 |
| WO | 2004044651 A1 | 5/2004 |
| WO | WO 2004/055594 | 7/2004 |

OTHER PUBLICATIONS

Communication from the European Patent Office for Appl. No. 05012232.4-2222 dated Jul. 26, 2007.
M. Colburn et al.; "Step and Flash Imprint Lithography: A New Approach to High-Resolution Patterning"; Proceedings of the SPIE's 24$^{th}$ International Symposium on Microlithography: Emerging Lithographic Technologies III; vol. 3676, Part One; pp. 379-389; (Mar. 1999).

* cited by examiner

*Primary Examiner*—Maria Veronica D Ewald
(74) *Attorney, Agent, or Firm*—Rossi, Kimms & McDowell LLP

(57) ABSTRACT

A processing apparatus for transferring a relief pattern on a mold to a resist on a substrate through a compression of the mold against the resist, and an irradiation of light for exposing the resist onto the resist includes a mold chuck for holding the mold and for compressing the mold against the resist, and a deformation reducing part for reducing a deformation of the mold when the mold chuck applies a compression force to the mold.

8 Claims, 11 Drawing Sheets

PRIOR ART

PROCESSING APPARATUS AND METHOD

BACKGROUND OF THE INVENTION

The present invention relates generally to a processing apparatus and method, and more particularly to a processing apparatus and method that transfer a pattern of a mold as an original onto a substrate such as a wafer. The present invention is particularly suitable for a processing apparatus that uses the nanoimprint technology for fine processing to manufacture semiconductor devices, micro electro-mechanical systems ("MEMS's"), and the like.

The nanoimprint technology has already been known as an alternative to the photolithography that uses the ultraviolet ("UV") light, X-rays and electron beams to form fine patterns for semiconductor devices. The nanoimprint is a technology that presses or stamps a model or a mold, on which a fine pattern has been formed by the electron-beam exposure etc., against a substrate such as a wafer to which a resinous material (resist) is applied, thereby transferring the pattern onto the resist. The nanoimprint has some types, and one method is a photo-curing method. See, for example, M. Colburn et al., "Step and Flash Imprint Lithography: A New Approach to High-Resolution Patterning", Proceedings of the SPIE's 24th International Symposium on Microlithography: Emerging Lithographic Technologies III, Santa Clara, Calif., Vol. 3676, Part One, pp. 379-389, March 1999. The photo-curing method is a method of exposing the UV curable resin or the resist while pressing a transparent mold with the resist, and of releasing the mold after the resin is cured.

FIG. 14 is a sectional view showing a relationship among a conventional mold M, a mold chuck 11, and a mold chuck stage 12. The mold M having a relief pattern P on its surface is fixed onto the mold chuck 11 by a mechanical means (or positioning pins) 11P. The mold chuck 11 is similarly fixed onto the mold chuck stage 12 by a mechanical means (not shown). The mold chuck 11 and the mold chuck stage 12 have openings 11H and 12H for transmitting to the mold M the UV light irradiated from a light source (not shown). Plural load sensors (not shown) that serve as a force detecting means are attached to the mold chuck 11 or the mold chuck stage 12.

The mold M is pressed against the resist (not shown) via the mold chuck stage 12 and the mold chuck 11. In pressing, the mold chuck stage 12 varies the inclination of the mold chuck 11, and a servomotor (not shown) adjusts the compression state of the mold M, in accordance with the outputs of the load sensors. Thereafter, the UV light is irradiated onto the mold M via the openings 11H and 12H.

As shown in FIG. 14, the conventional mold chuck 11 applies a compression force to the periphery of the mold M, and has the central opening 11H to transmit the irradiated UV light. Therefore, in pressing, the rear surface of the mold M deforms at part corresponding to the opening 11H, and the transfer accuracy of the pattern on the mold M's surface deteriorates. As the mold M becomes large for the increased throughput of the apparatus, the opening 11H in the mold chuck 11 becomes accordingly large and the problem becomes conspicuous. In addition, the load sensors are not enough to precisely measure the compression state of the mold against the resist and the pattern transfer accuracy cannot improve consequently. Moreover, when there is a temperature difference between the mold and the wafer, the compression of the mold causes a local thermal strain on the wafer, and lowers the transfer accuracy.

BRIEF SUMMARY OF THE INVENTION

The present invention is directed to a processing apparatus and method with the maintained pattern transfer accuracy.

A processing apparatus according to one aspect of the present invention for transferring a relief pattern on a mold to a resist on a substrate through a compression of the mold against the resist, and an irradiation of light for exposing the resist onto the resist includes a mold chuck for holding the mold and for compressing the mold against the resist, and a deformation reducing part for reducing a deformation of the mold when the mold chuck applies a compression force to the mold.

A processing apparatus according to another aspect of the present invention for transferring a relief pattern on a mold to a resist on a substrate through a compression of the mold against the resist, and an irradiation of light for exposing the resist onto the resist includes a mold chuck for holding the mold and for compressing the mold against the resist, and a temperature controller of a temperature of the mold.

A processing apparatus according to still another aspect of the present invention for transferring a relief pattern on a mold to a resist on a substrate through a compression of the mold against the resist, and an irradiation of first light for exposing the resist onto the resist includes a mold chuck for holding the mold and for compressing the mold against the resist, an interferometer that includes an optical system for projecting, through the mold chuck, second light having a wavelength that does not expose the resist onto the resist, and an image-pickup system for receiving reflected light of the second light from the resist, and a controller for controlling a compression state of the mold against the resist in accordance with an output of the interferometer.

A processing method according to still another aspect of the present invention for transferring a relief pattern on a mold to a resist on a substrate includes the steps of compressing the mold against the resist via a hollow mold chuck, controlling a force applied to the mold from a hollow part in the mold chuck, and irradiating light for exposing the resist onto the resist via the mold.

A device manufacturing method according to still another aspect of this invention including the steps of transferring a pattern onto resist on a substrate using the above processing apparatus, and etching the substrate. Claims for the device manufacturing method that exhibits operations similar to those of the above processing apparatus cover devices as their intermediate products and finished products. Such products include semiconductor chips, CCDs, LCDs, magnetic sensors, thin-film magnetic heads, etc.

Other objects and further features of the present invention will become readily apparent from the following description of the embodiments with reference to accompanying drawings.

DETAILED DESCRIPTION OF THE PREFERRED EMBODIMENTS

Figure 1:
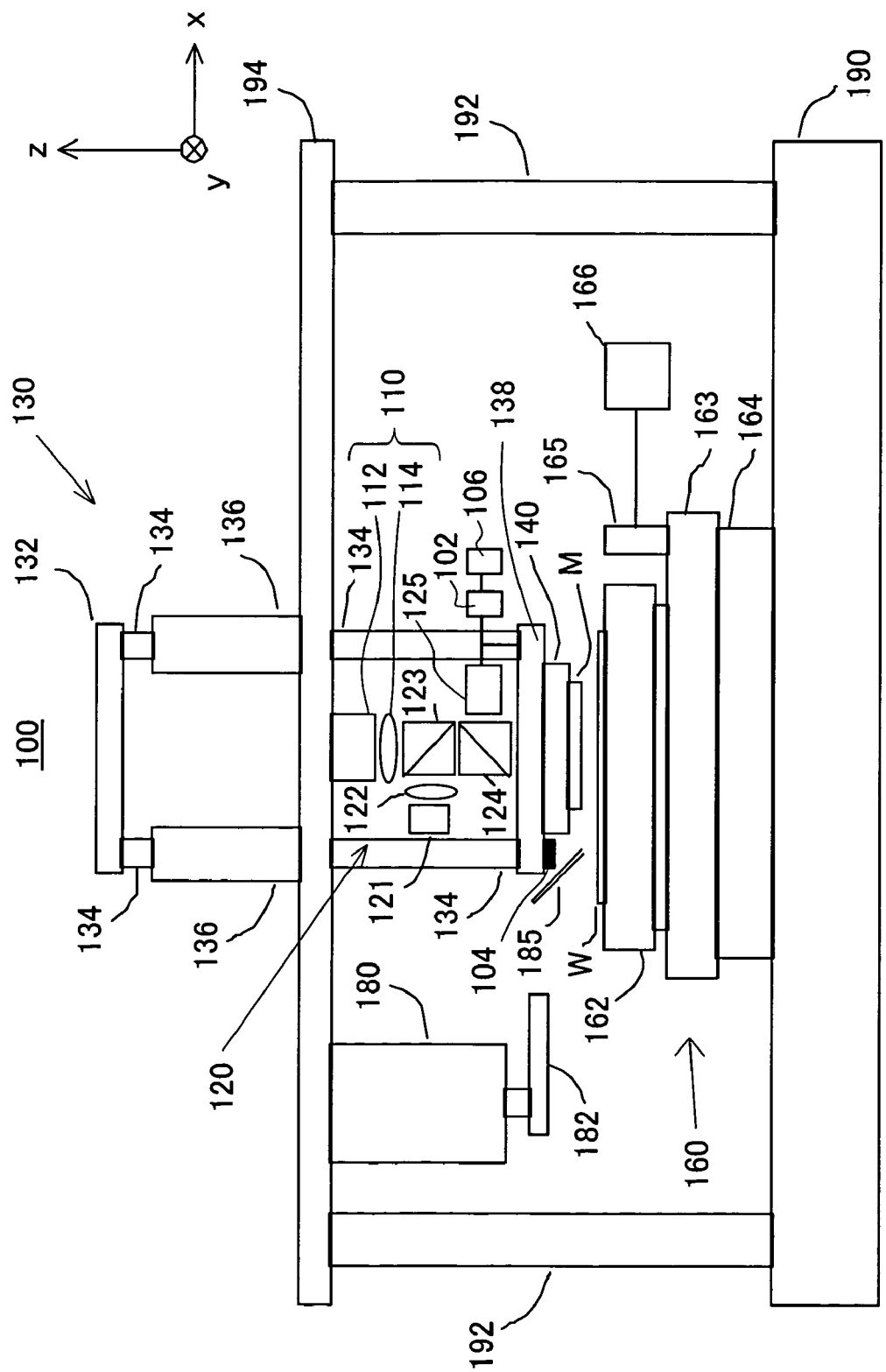
FIG. 1 is a schematic sectional view of a processing apparatus (or a nanoimprint apparatus) according to a first embodiment of the present invention.

Referring now to the accompanying drawings, a description will be given of a photo-curing nanoimprint apparatus (or pattern transferring apparatus) 100 that serves as a processing apparatus according to a first embodiment of this invention. Like elements in each figure are designated by the like reference numerals, and a duplicate description thereof will be omitted. Here, FIG. 1 is a schematic sectional view of the nanoimprint apparatus 100.

The nanoimprint apparatus 100 includes a compression control section, a light irradiation means 110, a mold M, a mold driver 130, a wafer (or substrate) W, a wafer driver 160, a deformation reducing means, a mold feeding section, a resist supply means, and other mechanisms.

The compression control section includes a controller 102 attached to a body (not shown) of the apparatus 100, a load sensor 104 attached to a mold chuck stage 138 or a mold chuck 140, which will be described later, and a memory 106 that stores a predetermined compression force value. The controller 102 determines whether the compression force of the mold M against the wafer W detected by the load sensor 104 is the predetermined value stored in the memory 106. The controller 102 not only controls the compression control section but also serves as a controller for each component in the apparatus 100, as described later.

The light irradiation means 110 irradiates via the mold M the UV light to the photo-curing resin or resist (not shown) that is applied to the wafer W, and cures the resist. The light irradiation means 110 includes a light source section 112 and an illumination optical system 114. The light source section 112 is controlled by the controller 102 and includes, for example, a halogen lamp, such as i-line and g-line, for generating the UV light. The illumination optical system 114 includes lenses and apertures that shape the illumination light and irradiate the light to the resist surface so as to expose and cure the resist. The illumination optical system 114 includes, but is not limited to, a collimator lens in FIG. 1 and beam splitters 123 and 124 arranged on the optical path. For example, the illumination optical system may include an optical integrator so as to uniformly illuminate the mold M if necessary.

The mold (or template) M has a pattern P to be transferred to the wafer W, and is made of a transparent material that transmits the UV light for curing the resist.

The mold driver 130 includes an imprint mechanism as a driver that presses the mold M downwardly and releases the mold M upwardly in FIG. 1, and a mold chuck for holding the mold M in the apparatus 100. The imprint mechanism moves the mold M up and down, and controls an orientation and rotation of the mold M and an alignment in the rotating direction between the mold M and the wafer W for close contact between the mold transfer surface and the wafer W.

Figure 2:
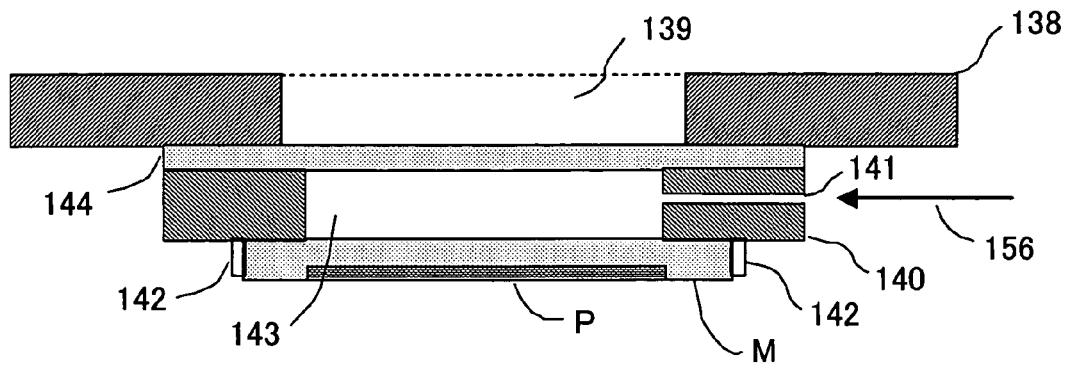
FIG. 2 is a schematic sectional view of the processing apparatus shown in FIG. 1 around a mold chuck.

The imprint mechanism includes a guide plate 132, plural guide bars 134, plural linear actuators 136, and a mold chuck stage 138. Each guide bar 134 is fixed onto the guide plate 132 at one end thereof, and perforates a top plate 194, and is fixed onto the mold chuck stage 138 at the other end thereof. The linear actuator 136 is controlled by the controller 102, and includes an air cylinder or a linear motor. The linear actuator 136 drives the guide bar 134 in the z direction in FIG. 1. The mold chuck stage 138 serves to correct a position of the mold M and mold chuck 140 in the θ direction or around the z axis, and has a tilt function to correct the inclination of the mold M. The mold chuck stage 138 has a penetration hole 139, as shown in FIG. 2, which will be described later, which transmits the light from the light source sections 112 and 121 (while the light source section 121 will be described later). While this embodiment uses the penetration hole, an alternate embodiment uses, instead of the penetration hole, another light transmitting member that transmits the light emitted from the light source section 112, such as a window made of such a glass material as quartz and calcium fluoride.

FIG. 2 is a sectional view around the mold chuck 140. The mold chuck 140 has, as shown in FIG. 2, an air supply passage 141 and a penetration hole that forms a closed space 143 as described later. While the closed space 143 covers the entire area, which is irradiated by the light from the light source sections 112 and 121, on the mold M in this embodiment, the closed space 143 may cover only part of the area according to the present invention, because the transfer accuracy maintains in this part of the area.

The mold M and a plate (or diaphragm) 144 are fixed onto the mold chuck 140. The mold M is fixed onto the mold chuck 140 via plural positioning pins 142. The positioning pin 142 restricts a position of the mold M on the mold chuck 140 when the mold M is installed onto the mold chuck 140. The plate 144 is transparent to the UV light and made, for example, of the quartz optical plate. The plate 144 is attached to the mold chuck stage 138 by a mechanical holding means (not shown) so that the plate 144 shields one end or middle of the penetration hole in the mold chuck 140. The plate 144 is fixed with the mold chuck 140 onto the mold chuck stage 138, after the mold M is attached to the mold chuck 140. The mold M and the plate 144 make the closed space 143 airtight in the mold chuck 140. The closed space 143 is connected to an air supply pipe 156 of an air supply part 150 through the air supply passage 141.

The interferometer 120, the plate 144 and the air supply part 150 form the deformation reducing means for reducing a deformation of the mold M when a force is applied to the mold M. The deformation reducing means preferably, but not necessarily, eliminates the deformation of the mold (or achieves a deformation amount of 0). According to the present invention, it is sufficient that the deformation reducing means simply reduces the deformation of the mold when the mold is pressed against the wafer.

The interferometer 120 detects a compression state of the mold M against the wafer W. The interferometer 120 projects the light having a wavelength different from that of the light from the light source section 112, and includes a light source section 121 that projects the monochromatic light, a collimator lens 122 (which may includes plural lenses), beam splitters 123 and 124, an image-pickup system 125, the controller 102 and the memory 106. The beam splitter 123 is arranged on the optical path of the light source section 112, and deflects the light projected from the light source section 112 toward the mold M. The beam splitter 124 is also arranged on the optical path of the light source section 112, and deflects the light reflected from the mold M toward the image-pickup system 125. The image-pickup system 125 includes, for example, a CCD. The memory 106 stores information used for a determination of the compression state, and the controller 102 determines whether the compression state observed by the interferometer 120 satisfies the predetermined state stored in the memory 106.

Figure 3:
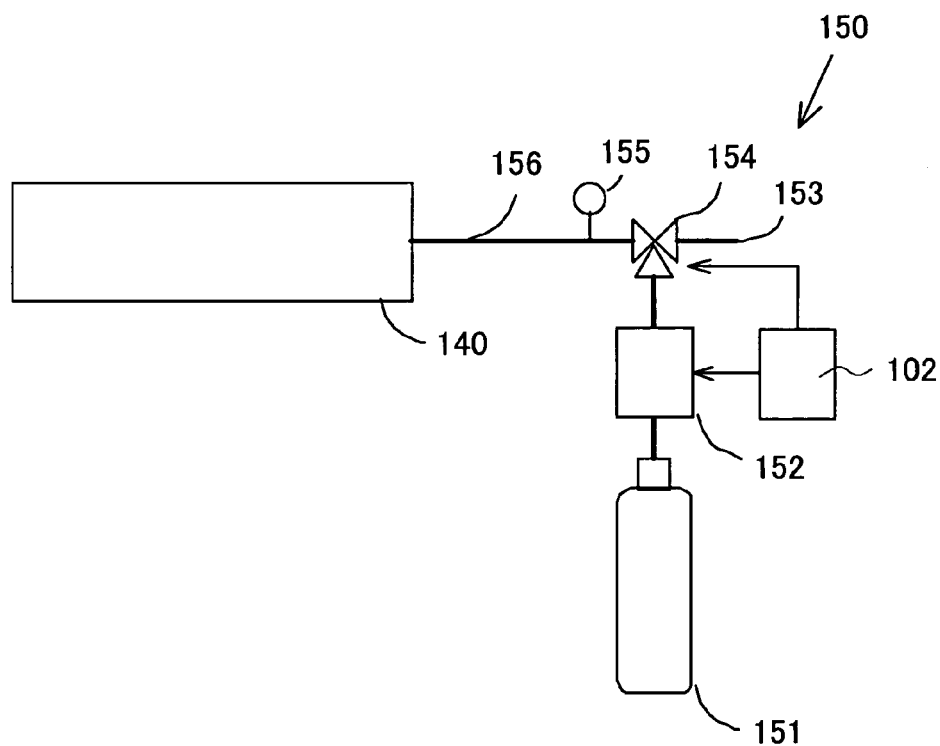
FIG. 3 is a schematic structure showing a deformation reducing means applicable to the processing apparatus shown in FIG. 1.

The air supply part 150 serves to inject the fluid (nitrogen in this embodiment) into the closed space 143, and includes a nitrogen gas tank 151, a pressure controller 152, an air open end 153, a three-way valve 154, a pressure sensor 155, and an air supply pipe 156. Here, FIG. 3 is a schematic structure of the air supply part 150. However, any types (gas, liquid and other modes) of fluid are usable as long as they transmit the light from the light source sections 112 and 121. When the fluid is the liquid, it preferably has the refractive index having a difference within ±10% of that of the mold chuck 140. More preferably, it has approximately the same refractive index as that of the mold chuck 140. Thereby, the curing performance maintains equally between the resist that receives the light that has passed the fluid and the resist that receives the light that has not passed the fluid. When the fluid's refractive index is different from the mold chuck's refractive index, an antireflection coating etc. that has a reflection prevention action (or a reflected light quantity reducing action) for the light emitted from the light source sections 112 and 121 may be provided between the closed space 143 and the mold chuck.

The controller 102 controls operations of the pressure controller 152, and opening and closing of the three-way valve 154. One end of the three-way valve 154 is connected to the air supply passage 156, another end of it is connected to the nitrogen gas tank 151 via the pressure controller 152, and remaining end of it is connected to the air open end 153. The air supply part 150 supplies the nitrogen gas from the nitrogen gas tank 151 to the closed space 143 while the pressure and the flow are controlled by the pressure controller 152, the three-way valve 154 and the pressure sensor 155.

Similar to that used for the conventional semiconductor process, the wafer W is an object onto which a pattern on the mold M is to be transferred, and which is turned to a semiconductor IC through the subsequent steps.

The wafer driver 160 includes a wafer chuck 162, a fine movement stage 163, an XY stage 164, a reference mirror 165, and a laser interferometer 166. The wafer chuck 162 holds the wafer W. The fine movement stage 163 is controlled by the controller 102, and has a correction function of a position of the wafer W in the θ direction (or its rotations around the z axis), an adjusting function of a z position of the wafer W, and a tilt function of an inclination of the wafer W. The XY stage 164 is controlled by the controller 102, and serves to move the wafer W to a target position. The wafer driver 160 enables the whole area of the wafer W to be transferred, realizes the overlay of fine patterns due to precise positioning and the orientation adjustment function of a surface of the wafer W. The reference mirrors 165 are attached to the fine movement stage 163 in the x and y directions (although the reference mirror 165 in the y direction is not shown), and reflect the light from the laser interferometer 166. The reference mirror 165 and the laser interferometer 166 serve to measure a position of the fine movement stage 163. The laser interferometer 166 is controlled by the controller 102.

The mold feeding section includes a mold feed robot 180, which holds and feeds the mold M using a hand 182 and a vacuum attraction.

The resist supply means includes a tank (not shown) that stores the resist that is pre-cured or have not yet received the UV light, a nozzle 185 that is connected to the tank and drops the resist onto the wafer W surface, and a valve (not shown) that switches between dropping of the resist from the nozzle 185 and stopping dropping of the resist. Preferably, the resist supply amount is controlled. For example, in controlling the supply amount, the opposing area between the mold M and the wafer W is calculated using the coordinate position of the XY stage 164, and the area is multiplied with a sum of an average height of the relief pattern of the mold M and the interval between the mold M and the wafer W are multiplied with one another. The volume is thus calculated as the necessary supply amount. Thereby, the unnecessary resist is prevented from spilling from the wafer W and contaminating the wafer chuck 162 and the XY stage 164.

Other mechanisms include a stool 190 that supports the XY stage 164, plural columns 192 that stand on the stool 190, and a top plate 194 supported by the columns 192. The stool 190 supports the whole apparatus 100 as well as forming a reference plane for the XY stage 164 to move along. The stool 190 is installed on the floor via a damper (not shown). The columns 192 support the components above the wafer W from the light source section 112 to the mold M.

Figure 4:
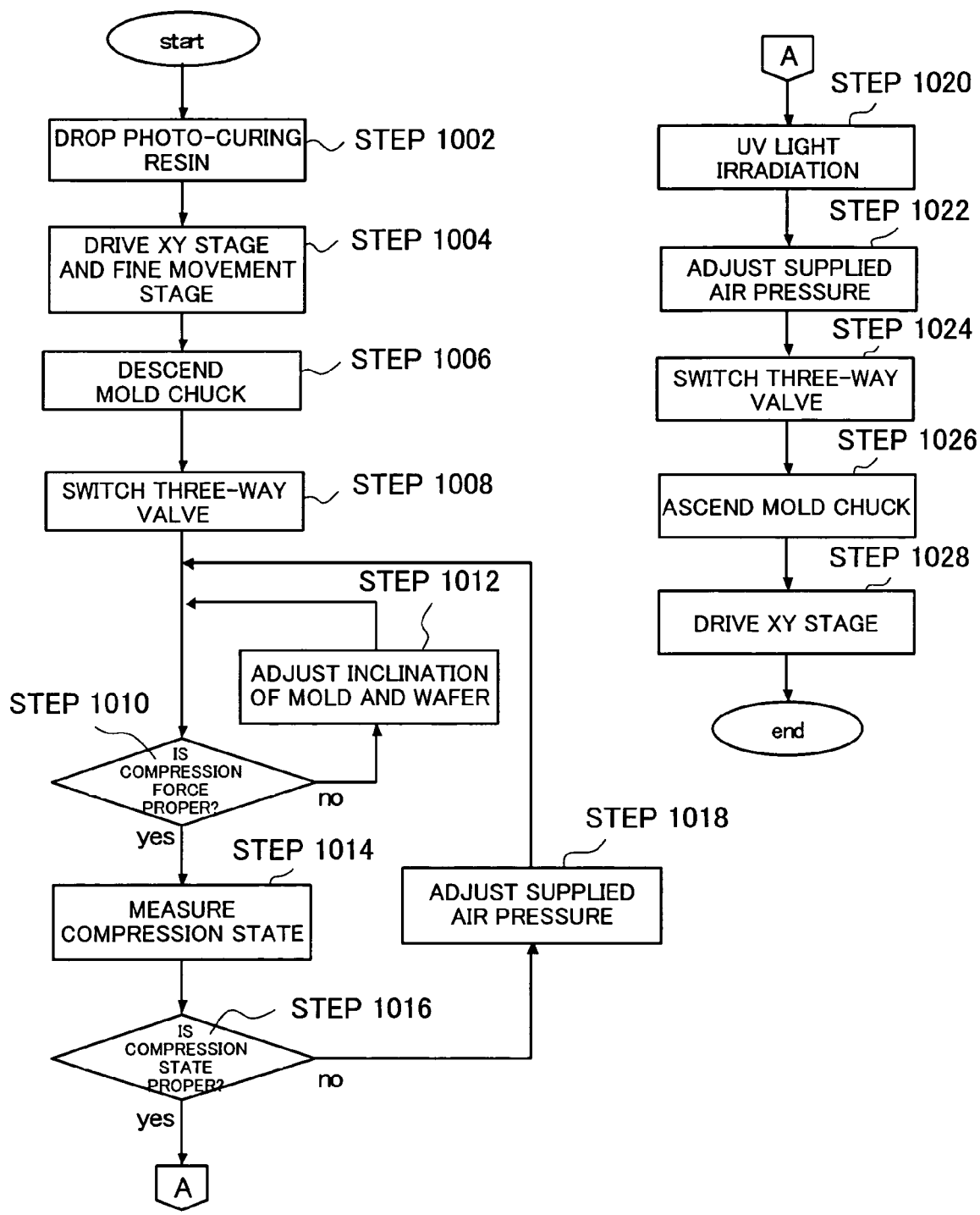
FIG. 4 is a flowchart for explaining an operation of the processing apparatus shown in FIG. 1.

Referring now to FIG. 4, a description will be given of an operation of the nanoimprint apparatus 100. Here, FIG. 4 is a flowchart for explaining an operation of the nanoimprint apparatus 100.

In operation, the wafer W to be transferred is mounted on the wafer chuck 162 by a wafer feed system (not shown). The wafer chuck 162 holds the wafer W through the vacuum attraction. First, the XY stage 164 is driven so as to move the wafer chuck 162 mounted with the wafer W, and position a pattern transfer spot or a shot on the wafer W below the nozzle 185.

Next, the nozzle 185 drops a proper amount of resist upon a target shot on the wafer W (step 1002). Next, the wafer W is positioned (step 1004). More specifically, after the XY stage 164 is driven so that the shot plane opposes to the pattern P of the mold M, the fine movement stage 163 is driven so as to adjust the height and inclination of the wafer chuck 162 in the z direction. In addition, the shot surface on the wafer W is aligned with the reference plane (not shown) of the apparatus 100.

Next, the imprint mechanism drives the linear actuator 136 so as to descend the mold chuck 140 (and the mold M) to the predetermined position, and press the mold M against the resist (step 1006). A load sensor in the imprint mechanism determines a completion of the compression. Next, the three-way valve 154 is switched to the nitrogen gas tank 151 from the air open end 153 (step 1008). This time, due to the control by the pressure controller 152, the nitrogen gas from the nitrogen gas tank 151 is prevented from flowing into the air supply pipe 156. The controller 102 determines whether the compression force falls within a predetermined range based on the output of the load sensor 104 (step 1010).

When determining that the compression force does not fall within the predetermined range (step 1010), the controller 102 adjusts the compression force of the mold M by changing a position and an inclination of the mold chuck 140 in the z direction using the mold chuck stage 138 or by changing a position and an inclination of the wafer chuck 162 in the z direction using the fine movement stage 163 (step 1012). Steps 1010 and 1012 are repeated until the compression force falls within the predetermined range.

On the other hand, when determining that the compression force of the mold M is proper (step 1010), the controller 102 controls the light source section 121 to irradiate onto the mold M the monochromatic light having a wavelength that does not expose the resist through the beam splitters 123 and 124, and allows the image-pickup system 125 to receive the reflected light via the beam splitter 124. The information on the moiré fringe observed by the image-pickup system 125 is sent to the controller 102. In response, the controller 102 measures the compression state of the mold M against the resist on the wafer W based on this information (step 1014), and then determines whether the compression state of the mold M is proper based on the moiré fringe distribution (step 1016).

When determining that the compression state is improper due to the biased moiré fringe distribution (step 1016), the controller 102 controls the pressure controller 152 to supply the nitrogen gas to the air supply pipe 156 from the nitrogen gas tank 151 (step 1018, arrow direction in FIG. 2). The nitrogen gas flows in the closed space 143 in the mold chuck 140 through the air supply passage 141, and presses the rear surface of the mold M. The pressure sensor 155 then measures the pressure in the closed space 143.

Following step 1018, the flow returns to step 1010: The controller 102 reconfirms whether the compression force changes due to the nitrogen gas supply to the closed space 143 (step 1010). When determining that the compression force is proper, the controller 102 iterates steps 1014, 1018 and 1010 until step 1014 measures the unbiased moiré fringe distribution and the proper compression state of the mold M. In this period, the controller 102 controls the pressure of the nitrogen gas supplied from the nitrogen gas tank 151 through the pressure controller 152 in accordance with the moiré fringe distribution and the output from the pressure sensor 155. If the same apparatus needs to transfer the same pattern under almost the same environment, the previous condition is memorized and nitrogen may be supplied and/or exhausted (in addition to an inclination adjustment between the mold and the wafer, etc.) before, during or after the press of the mold against the wafer according to the previous condition. It is preferable, however, that the light is irradiated after the nitrogen is supplied and exhausted and the inclination etc. between the mold and the wafer is adjusted, and through steps 1010 and 1016 in FIG. 4.

When determining that the compression state of the mold M is proper (step 1016), the controller 102 controls the light source section 112 to irradiate the UV light onto the resist via the mold M for a predetermined time period and cure the resist (step 1020).

Next, the controller 102 controls the pressure controller 152 to lower the pressure of the nitrogen gas supplied from the nitrogen gas tank 151 and release the pressurized state of the closed space 143 (step 1022). Next, the controller 102 switches the three-way valve 154 from the nitrogen gas tank 151 to the air open end 153 (step 1024).

Next, the controller 102 drives the linear actuator 136 and ascends the mold chuck 140, thereby separating the mold M from the resist of the wafer W (step 1026). Finally, the controller 102 drives the XY stage 164 (step 1028), and moves the wafer W so that the next shot is located below the nozzle 185. This flow is repeated for sequential transferring in the step-and-repeat manner. After all the shots are transferred, the wafer W is fed out and the next wafer W is fed in.

As discussed above, in pressing the mold M, the pressurized closed space 143 in the mold chuck 140 above the mold M prevents the deformation of the rear surface of the mold at an area corresponding to the closed space 143.

Preferably, this first embodiment controls the temperature of the fluid to be supplied to the closed space 143 via the pipe 156, to be approximately constant (within ±1° C. of the predetermined temperature or more preferably precisely equal to the predetermined temperature). In addition, it is preferable to supply to the closed space 143 the fluid having the temperature that can maintain the pattern and the mold that holds the pattern approximately constant (within ±1° C. of the predetermined temperature or more preferably precisely equal to the predetermined temperature). This structure narrows the temperature distributions of the pattern and the mold, and prevents their deformations (or reduces their deformation amounts) due to the temperature distributions. Such a structure preferably has another exhaust pipe for exhausting the fluid from the closed space in addition to the pipe 156 that serves as a fluid supply pipe to the closed space 143.

Figure 5:
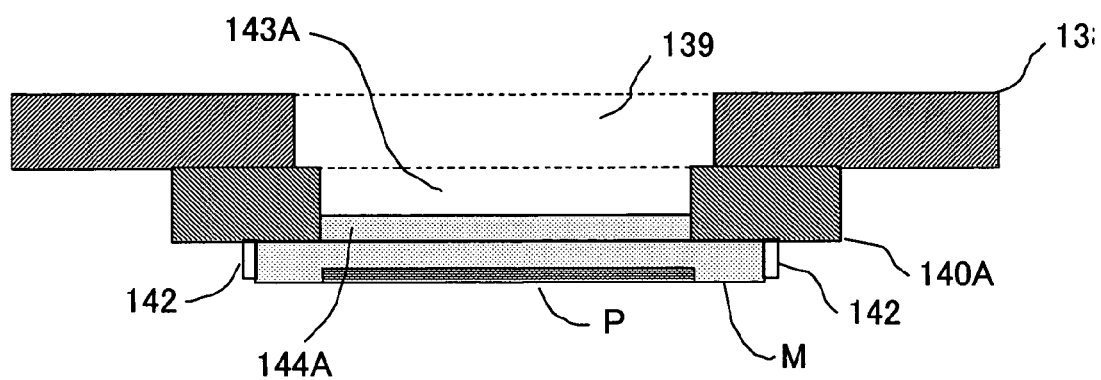
FIG. 5 is a schematic sectional view of a mold chuck according to a second embodiment.

Referring now to FIG. 5, a description will be given of a second embodiment of the present invention. Here, FIG. 5 is a sectional view around the mold chuck 140A. This embodiment is different from the first embodiment in that the plate 144A that is transparent to the UV light is arranged on the mold M in the penetration hole 143A in the mold chuck 140A. The plane of the plate 144A at the mold M side, which is fixed in the penetration hole 143A in the mold chuck 140A, forms one level mold contact surface of the mold chuck 140A. Therefore, no closed space 143 is needed unlike FIG. 2. While this embodiment provides the plate 144A so as to cover the entire area of the mold M that exposes from the penetration hole 143A, the plate 144A may be jointed with at least part of the mold M on the mold M's area that receives the light from the light source section 112 according to the present invention, because the rigidity of the mold M improves at this part of the area. The plate 144A may be as thick as the penetration hole 143A and fill the penetration hole 143A.

Figure 6:
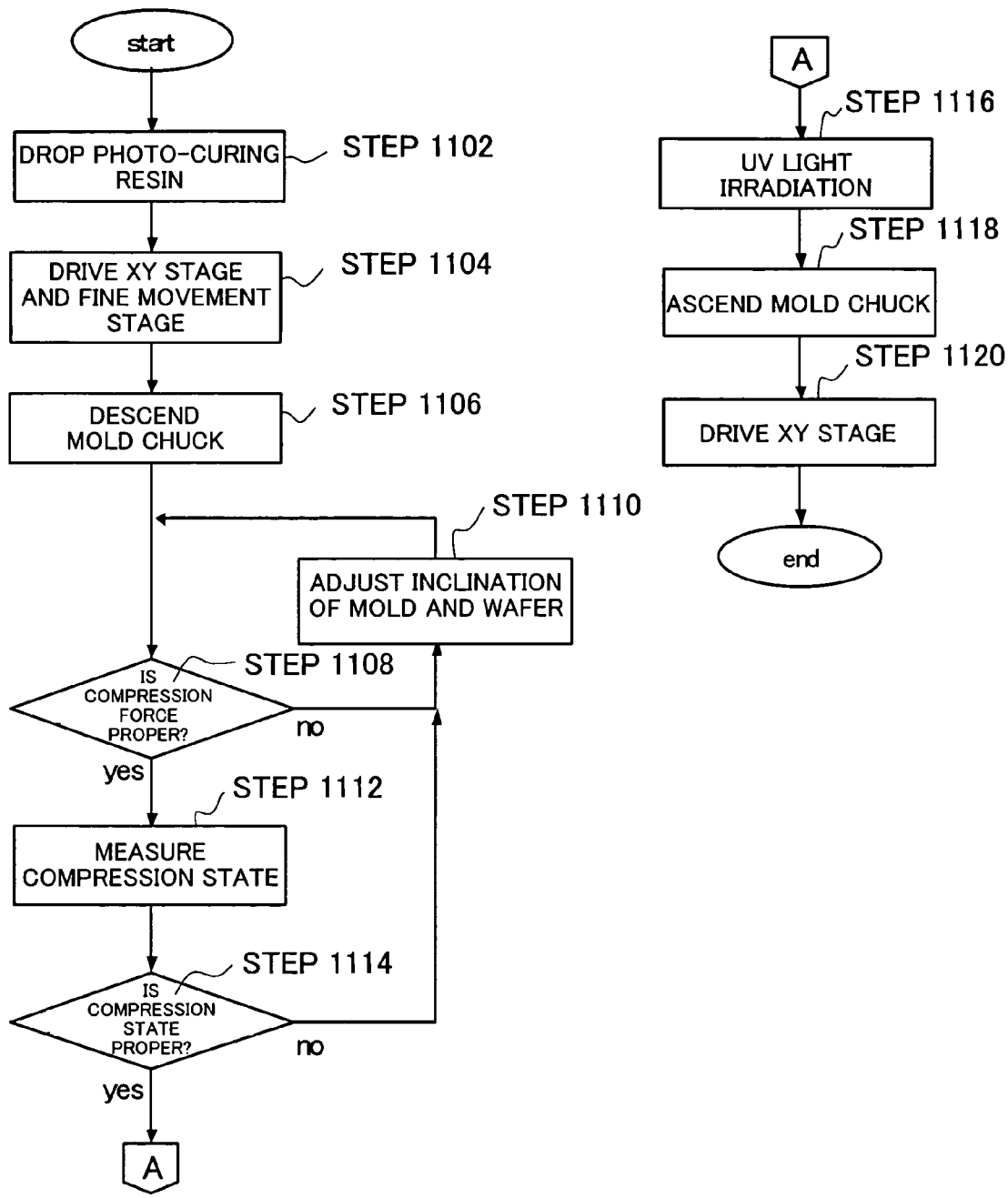
FIG. 6 is a flowchart for explaining an operation of the processing apparatus of the second embodiment having the mold chuck shown in FIG. 5.

Referring now to FIG. 6, a description will be given of an operation of the nanoimprint apparatus 100 that uses the mold chuck 140A of the second embodiment. Here, FIG. 6 is a flowchart for explaining an operation of the nanoimprint apparatus 100 that uses the mold chuck 140A of the second embodiment. This flowchart is different from that of FIG. 4 in that the transparent plate 144A is closely contacts the rear surface of the mold M, and eliminates the pressure control to the closed space 143.

First, the XY stage 164 is driven so as to move the wafer chuck 162 mounted with the wafer W, and position a pattern transfer spot or a shot on the wafer W below the nozzle 185. Next, the nozzle 185 drops the resist upon a target shot on the wafer W (step 1102). Next, the wafer W is positioned (step 1104). More specifically, after the XY stage 164 is driven so that the shot plane opposes to the pattern P of the mold M, the fine movement stage 163 is driven so as to adjust the height and inclination of the wafer chuck 162 in the z direction. In addition, the shot surface on the wafer W is aligned with the reference plane (not shown) of the apparatus 100.

Next, the linear actuator 136 is driven so as to descend the mold chuck 140 to the predetermined position and press the mold M against the resist (step 1106). The controller 102 then determines, based on the output from the load sensor 104, whether the compression force falls within the predetermined range (step 1108).

When determining that the compression force does not fall within the predetermined range (step 1108), the controller 102 adjusts the compression force of the mold M by changing a position and an inclination of the mold chuck 140 in the z direction using the mold chuck stage 138 or by changing a position and an inclination of the wafer chuck 162 in the z direction using the fine movement stage 163 (step 1110). Steps 1108 and 1110 are repeated until the compression force falls within the predetermined range.

On the other hand, when determining that the compression force of the mold M is proper (step 1108), the controller 102 controls the light source section 121 to irradiate onto the mold M the monochromatic light having a wavelength that does not expose the resist through the beam splitters 123 and 124, and allows the image-pickup system 125 to receive the reflected light via the beam splitter 124. The information on the moiré fringe observed by the image-pickup system 125 is sent to the controller 102. In response, the controller 102 measures the compression state of the mold M against the resist on the wafer W based on this information (step 1112), and then determines whether the compression state of the mold M is proper based on the moiré fringe distribution (step 1114).

When determining that the compression state is improper due to the biased moiré fringe distribution (step 1114), the controller 102 feeds the flow back to step 1110. The loop of steps 1114 and 1110 iterates until the compression force and the compression state of the mold M become proper.

When determining that the compression state of the mold M is proper (step 1114), the controller 102 controls the light source section 112 to irradiate the UV light onto the resist via the mold M for a predetermined time period and cure the resist (step 1116). Next, the controller 102 drives the linear actuator 136 and ascends the mold chuck 140, thereby separating the mold M from the resist of the wafer W (step 1118). Finally, the controller 102 drives the XY stage 164 (step 1120), and moves the wafer W so that the next shot is located below the nozzle 185.

As discussed above, in pressing the mold M, the plate 144A that is transparent to the irradiation light and contacts the rear surface of the mold M in the penetration hole 143A in the mold chuck 140A prevents the deformation of the rear surface of the mold M at an area corresponding to the penetration hole 143A. In addition, this embodiment does not require the pressure control mechanism of the closed space 143 as in the first embodiment in FIG. 3.

Figure 7:
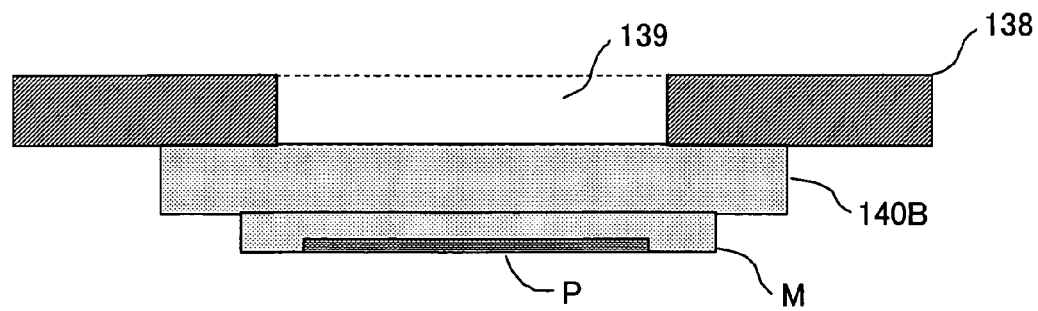
FIG. 7 is a schematic sectional view of a mold chuck according to a third embodiment.

Referring now to FIG. 7, a description will be given of a third embodiment according to the present invention. Here, FIG. 7 is a sectional view around the mold chuck 140B. This embodiment is different from the first embodiment in that the mold chuck 140B made of a transparent material to the UV light is jointed with the entire rear surface of the mold M without intervening the plate 144.

In FIG. 7, the mold chuck 140B that holds the mold M having the relief pattern P is fixed onto the mold chuck stage 138 by a mechanical holding means (not shown), and is made of a material, such as quarts, which is transparent to the light irradiated from the light source section 112. The material having high transparency to the irradiated light is applicable to a mold chuck that needs to be thicker so as to hold the mold M than the transparent plate 144 of the first embodiment. The pattern transfer is similar to that of the mold chuck 140A of the second embodiment.

The third embodiment makes the mold chuck 140B transparent to the irradiated light, and eliminates the penetration hole 143 for transmitting the irradiated light. The mold chuck 140B closely contacts the entire rear surface of the mold M, and prevents the deformation of the rear surface of the mold M in pressing the mold.

Figure 8:
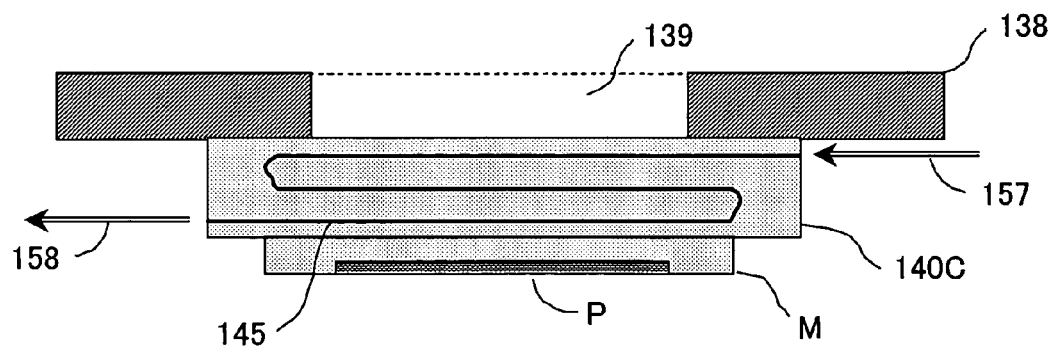
FIG. 8 is a schematic sectional view of a mold chuck according to a fourth embodiment.

Referring now to FIG. 8, a description will be given of the fourth embodiment according to the present invention. Here, FIG. 8 is a sectional view around the mold chuck 140C. This embodiment is different from the third embodiment in a temperature control mechanism. As shown in FIG. 8, the mold chuck 140C forms a temperature control fluid channel 145 in the mold chuck 140C. One end of the channel 145 is connected to a fluid supply pipe 157 from a fluid temperature controller (not shown), and the other end of the channel 145 is connected to a fluid recovery pipe 158 of the fluid temperature controller. The fluid that is precisely temperature controlled by the fluid temperature controller and has the same refractive index as that of the mold chuck 140C circulates through the temperature control fluid channel 145. Therefore, the temperature of the mold M held by the mold chuck 140C is maintained constant. When the temperature of the fluid that circulates through the temperature control fluid channel 145 is set to that of the wafer chuck 162, no temperature difference occurs between the wafer W and the mold M or no local thermal strain occurs on the wafer W in pressing the mold M.

This embodiment allows the fluid's refractive index to be different from that of the mold chuck 140C within ±10% of the refractive index of the mold chuck 140C. Thereby, the curing performance maintains equally between the resist that receives the light that has passed the fluid and the resist that receives the light that has not passed the fluid.

The wafer chuck 162 may have a similar temperature control fluid channel, and the fluid temperature controller may control the temperature of the wafer chuck 162 simultaneously. The first to third embodiments may obtain the similar effects when the mold M has the temperature control fluid channel, and the precisely temperature-controlled fluid that has the same refractive index as that of the mold M circulates. The second embodiment can obtain similar effects by providing the plate 144A with the temperature control fluid channel, and circulating the precisely temperature-controlled fluid that has the same refractive index as that of the mold M. The other actions and effects of this embodiment, such as pattern transferring are the same as those of the second and third embodiments.

A pipe in the mold chuck 140C, which connects the fluid supply pipe 157 to the fluid recovery pipe 158, may be located in the light irradiation area, but preferably located outside the light irradiation area. This configuration prevents scattering of the irradiated light due to the pressure difference of the fluid in the pipe, and irradiations of the light upon the wafer with the non-uniform light intensity (or reduces the non-uniform light intensity on the wafer).

Figure 9:
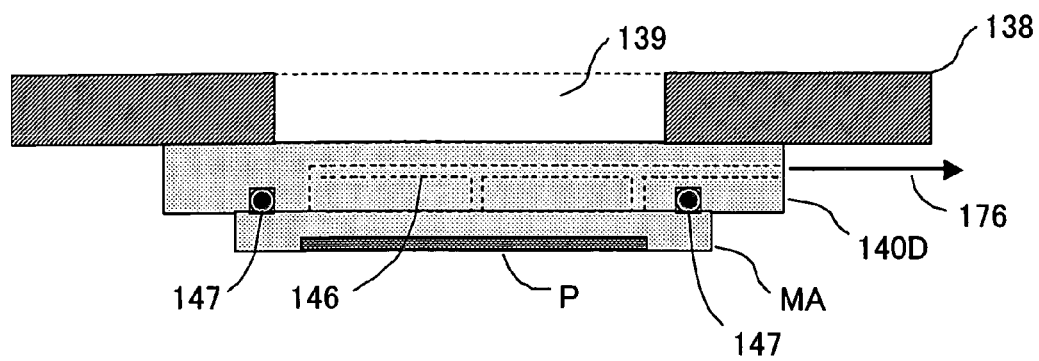
FIG. 9 is a schematic sectional view of a mold chuck according to a fifth embodiment.
Figures 10A, 10B:
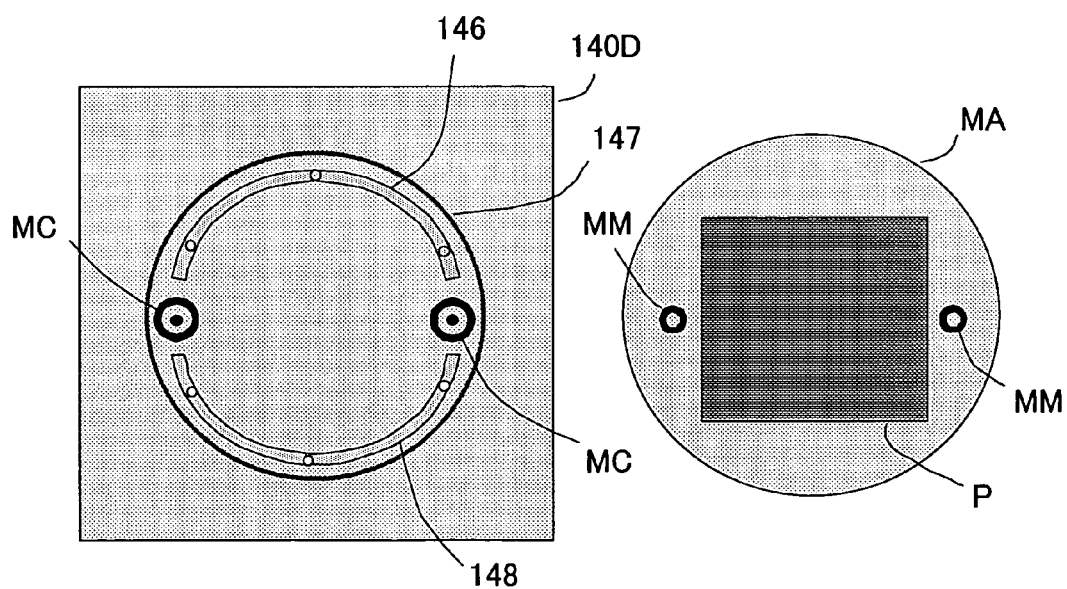
FIG. 10 is a schematic sectional view of the mold chuck shown in FIG. 9 and mold.
Figure 11:
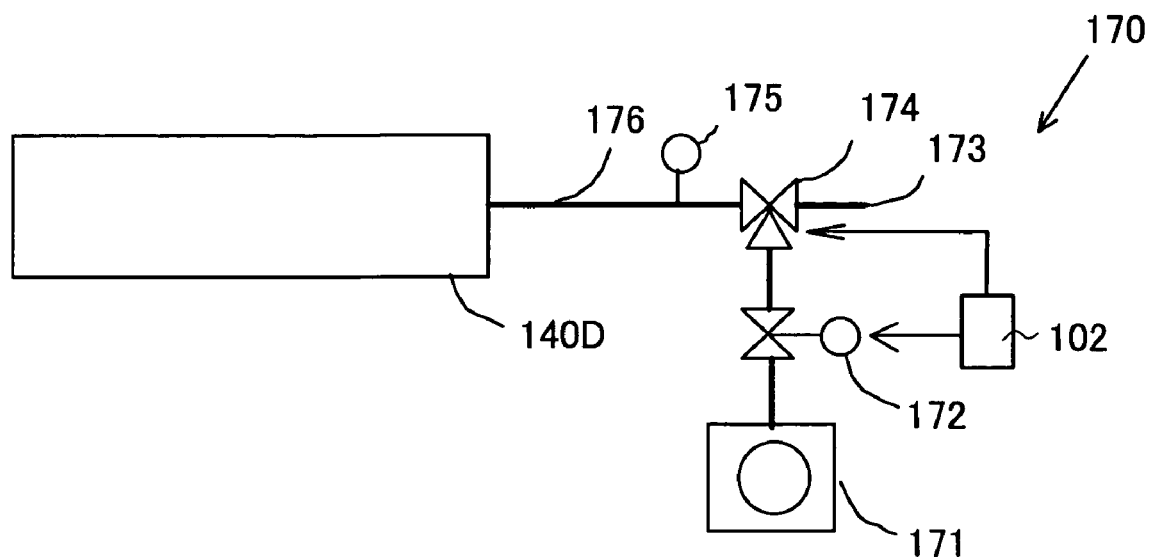
FIG. 11 is a schematic structure of an exhaust part applicable to the mold chuck shown in FIG. 9.

Referring now to FIG. 9, a description will be given of a fifth embodiment according to the present invention. Here, FIG. 9 is a sectional view around the mold chuck 140D. This embodiment is different from the third embodiment in jointing between the mold and mold chuck. FIG. 10A is a plane view of a mold chuck 140D viewed from the wafer W, and FIG. 10B is a plane view of a mold MA viewed from the wafer W. FIG. 11 is a schematic structure of the exhaust part 170 connected to the mold chuck 140D.

In FIG. 9, the mold chuck 140D that holds the mold MA having the relief pattern P is fixed onto the mold chuck stage 138 by a mechanical holding means (not shown), and is made of a material, such as quarts, which is transparent to the irradiation light from the light source section 112. The mold chuck 140D has an exhaust passage 146 in its inside, and is jointed with the mold M via an O-ring 147. The exhaust passage 146 is exhausted by an exhaust part 170.

The exhaust part 170 includes a vacuum pump 171, a valve 172, an air open end 173, a three-way valve 174, a pressure sensor 175, and a vacuum pipe 176. Here, FIG. 11 is a schematic structure of the exhaust part 170. The valve 172 is controlled by the controller 102. The three-way valve 174 is controlled by the controller 102, its one end being connected to the vacuum pump 171 via the valve 172, its another end being connected to the air open end 173, and its remaining end is connected to the exhaust passage 146 via the vacuum pipe 176.

In FIG. 10, an alignment mark MC for use with the mold MA is drawn on the mold chuck 140D at a position inside the O-ring 147, at which the irradiated UV light does not pass. On the other hand, an alignment mark MM is drawn on the mold MA at a position corresponding to the position of the alignment mark MC outside the pattern P.

Referring now to FIGS. 9-10B, a description will be given of an attachment of the mold MA to and detachment of the mold MA from the mold chuck 140D.

In attaching the mold MA to the mold chuck 140D, the mold MA is picked up from a mold storage (not shown) by the mold feed robot 180, and fed to a position under the mold chuck 140D. Next, the image-pickup system 125 observes the alignment mark MM on the mold MA and the alignment mark MC on the mold chuck 140D, and the hand 182 of the mold feed robot 180 adjusts a position of the mold MA on the xy plane and the mold chuck stage 138 adjusts a position of the mold chuck 140D in the θ direction around the z-axis direction so that mold MA moves to a position where two alignment marks concentrically overlap each other. When two alignment marks concentrically overlap each other, the z position of the hand 182 of the mold feed robot 180 changes so as to make the mold closely contact the mold chuck 140D.

Next, the three-way valve 174 is switched from the air open end 173 to the vacuum pump 171, and the vacuum pump 171 exhausts the air in the exhaust passage 146 in the mold chuck 140D as the valve 172 opens. When the output of the pressure sensor 175 decreases down to the predetermined pressure, the hand 182 of the mold feed robot 180 stops an attraction, and the hand 182 returns to the standby position shown in FIG. 1. On the contrary, in detaching the mold MA from the mold chuck 140D, the mold feed robot 180 is driven and the hand 182 is moved to a position under the mold MA. Next, the z position of the hand 182 is moved to a position where the hand 182 closely contacts the mold MA, and the hand 182 is turned to an attraction state.

Next, the valve 172 shown in FIG. 11 is closed, and the three-way valve 174 is switched to the air open end 173. Then, the z position of the hand 182 of the mold feed robot 180 is changed so as to separate the mold MA from the mold chuck 140D. Finally, the mold MA is housed in the mold storage (not shown) by the mold feed robot 180.

As discussed, when it is difficult to attach a positioning pin such as the positioning pins 11P to the optically transparent mold chuck, an alignment mark is provided to each of the mold and the mold chuck so as to facilitate positioning of the mold. Since no positioning pin is necessary, this embodiment prevents an accidental crack of the mold due to a collision with the positioning pin when the mold is installed. The second embodiment can obtain a similar effect by providing an alignment mark MC to the plate 144A and the alignment mark MM to the mold M.

While the above first and second embodiments discuss means for reducing or preferably eliminating a deformation amount of the mold, in particular, the mold pattern, the present invention is not limited to these embodiments. For example, the pattern shape may be determined by taking a deformation of the mold (pattern) into account. This configuration does not necessarily require a reduction of the deformation of the mold (pattern), but require such an adjustment that the mold (pattern) has a predetermined deformation amount (or the mold (pattern) has a predetermined deformation state). The interferometer in the first and second embodiments may detect whether the deformation is the predetermine amount, but another means, such as means for checking the astigmatism state, may detect the deformation state of the mold.

Figure 12:
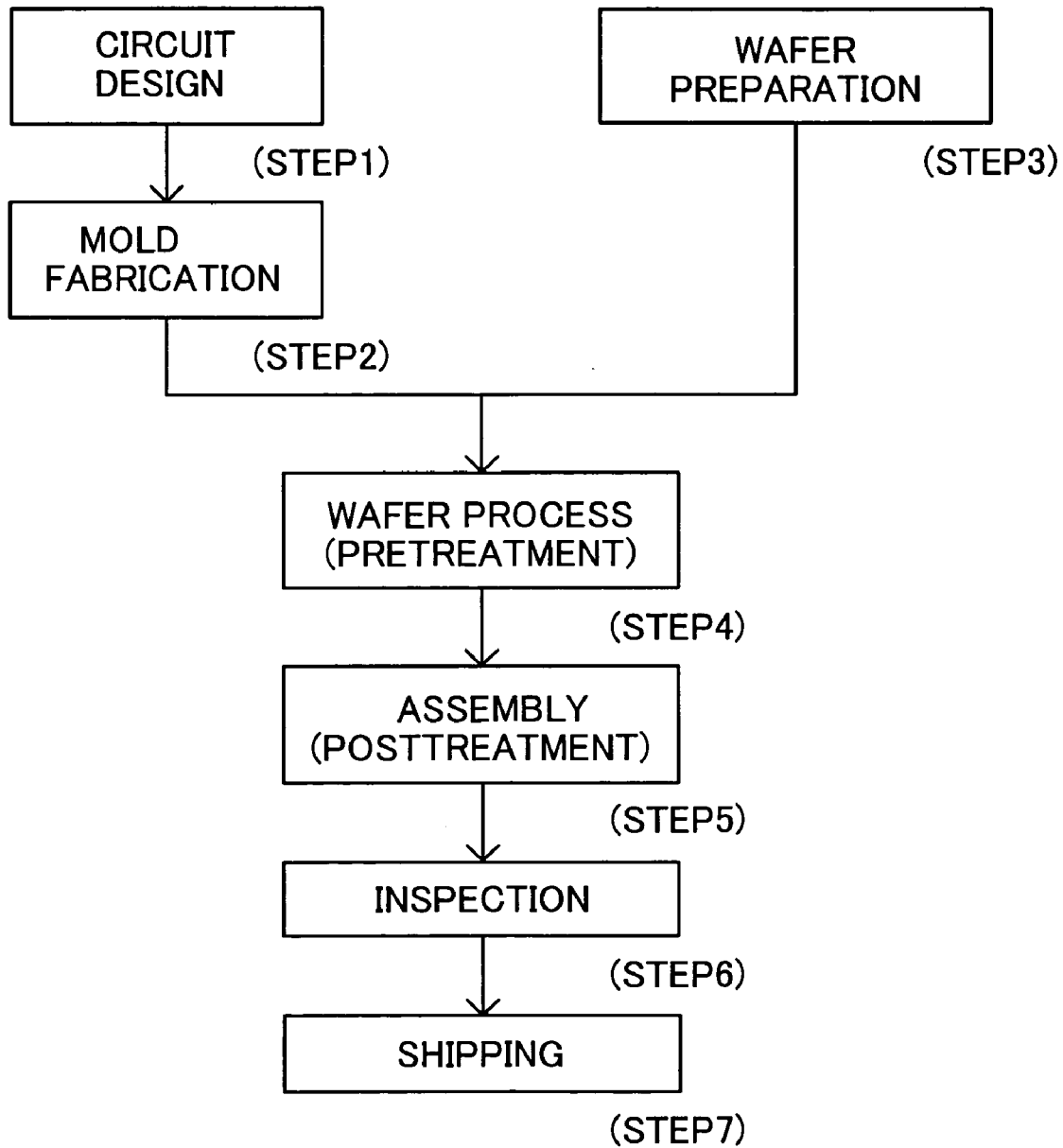
FIG. 12 is a flowchart for explaining a method for manufacturing a device (semiconductor chips such as ICs, LSIs, and the like, LCDs, CCDs, etc.) using the above processing apparatus.
Figure 13:
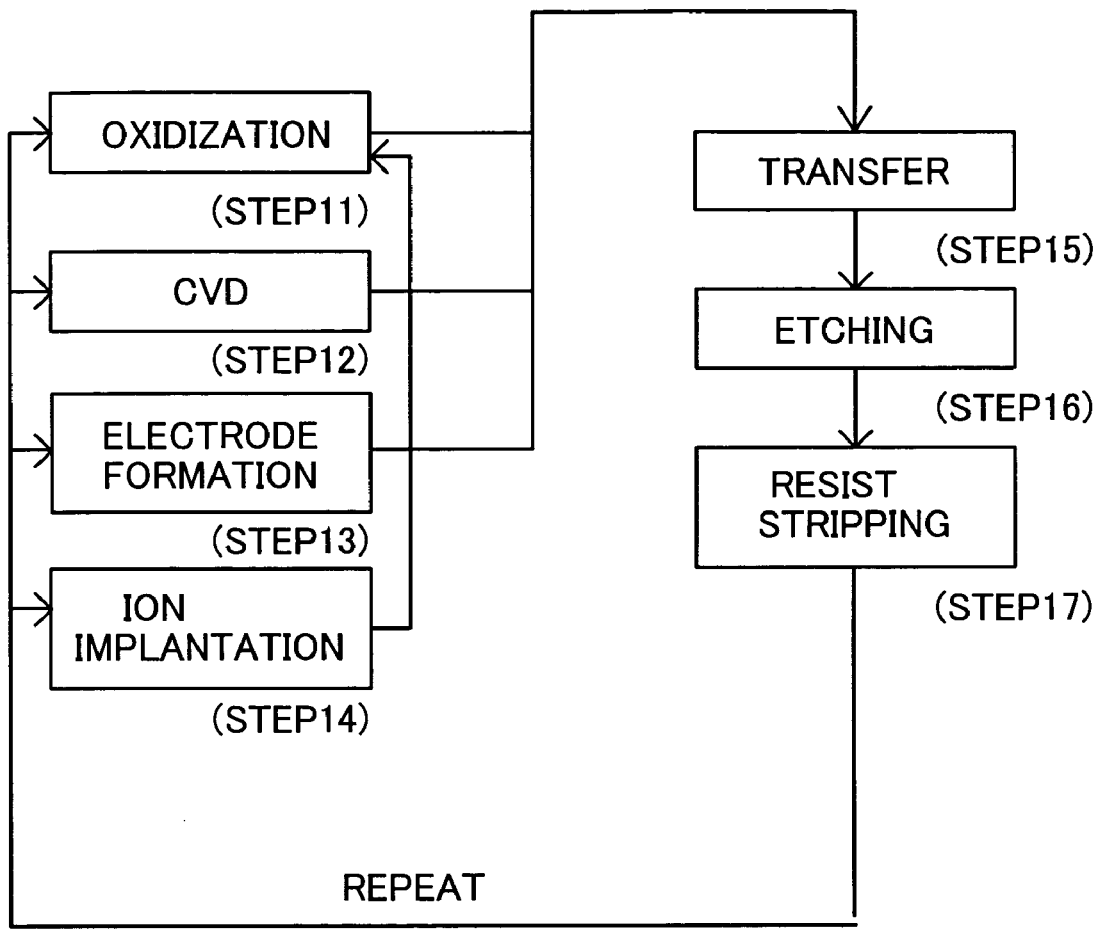
FIG. 13 is a detailed flowchart for Step 4 shown in FIG. 12.
Figure 14:
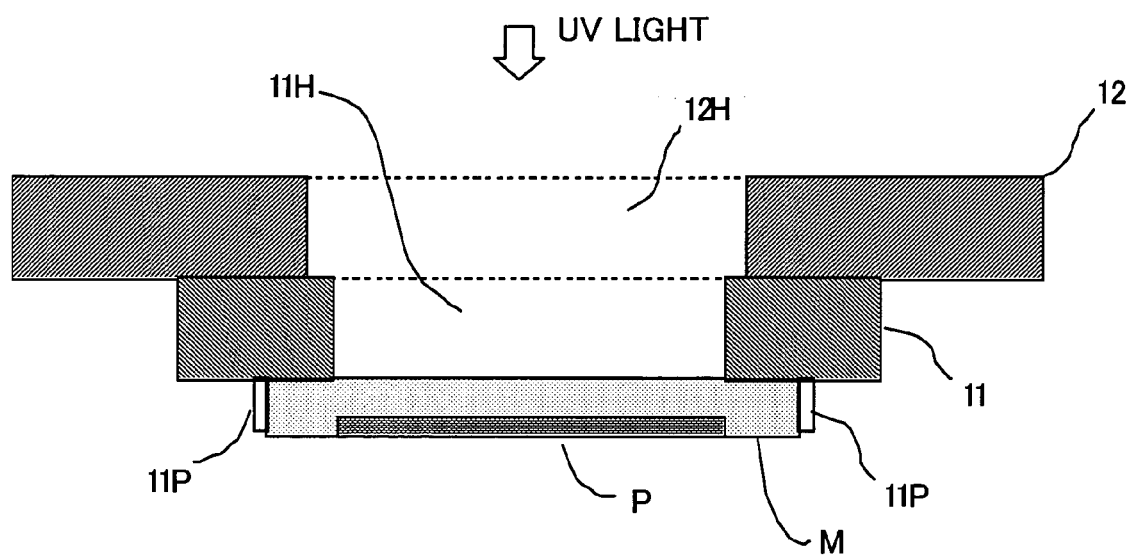
FIG. 14 is a sectional view around a conventional mold chuck.

Referring now to FIGS. 12 and 13, a description will be given of an embodiment of a device manufacturing method using the above nanoimprint apparatus. FIG. 12 is a flowchart for explaining how to fabricate devices (i.e., semiconductor chips such as IC and LSI, LCDs, CCDs, etc.). Here, a description will be given of the fabrication of a semiconductor chip as an example. Step 1 (circuit design) designs a semiconductor device circuit. Step 2 (mold fabrication) forms a mold that forms a pattern corresponding to a designed circuit pattern. Step 3 (wafer preparation) manufactures a wafer using materials such as silicon. Step 4 (wafer process), which is also referred to as a pretreatment, forms actual circuitry on the wafer through the nanoimprint technique using the mold and wafer. Step 5 (assembly), which is also referred to as a posttreatment, forms a semiconductor chip into the wafer formed in Step 4 and includes an assembly step (dicing and bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 13 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor deposition and the like. Step 14 (ion implantation) implants ions into the wafer. Step 15 (transfer) presses the mold against the wafer while applying a photosensitive material to the wafer, and irradiates the UV light to transfer the circuit pattern onto the wafer. Step 16 (etching) uses reactive ion etching (RIE) to complete the patterning operation. Step 17 (resist stripping) removes disused resist after etching. Thus, devices (i.e., semiconductor chips, LCD devices, photographing devices (such as CCDs, etc.), thin-film magnetic heads, and the like) are fabricated. These steps are repeated, and multi-layer circuit patterns are formed on the wafer. Thus, the device manufacturing method using the nanoimprint technology of this embodiment, and devices as a resultant product constitute one aspect of this invention. The present invention intends to cover devices as intermediate and final products of this device manufacturing method. Such devices include semiconductor chips such as LSI, VLSI and the like, CCDs, LCDs, magnetic sensors, thin film magnetic heads, and the like.

As discussed, this embodiment prevents a deformation of the mold rear surface by compressing the mold rear surface that has not been conventionally supported, and improves the pattern transfer accuracy. In particular, this embodiment is significantly effective as the mold becomes large for the improved throughput of the apparatus 100. In addition, the pattern transfer accuracy improves as the interferometer precisely measures and controls the mold's compression state. Moreover, the temperature control over the mold reduces both the temperature difference between the mold and wafer and a local thermal strain when the mold is compressed. Thereby, the yield improves and the productivity of the apparatus increases.

This embodiment can thus provide a processing apparatus and method having the maintained pattern transfer accuracy.

Further, the present invention is not limited to these preferred embodiments, and various variations and modifications may be made without departing from the scope of the present invention.

This application claims a benefit of foreign priority based on Japanese Patent Application No. 2004-173317, filed on Jun. 11, 2004, which is hereby incorporated by reference herein in its entirety as if fully set forth herein.

What is claimed is:

1. A processing apparatus for transferring a relief pattern onto a resist applied on a substrate comprising:
    a mold having the relief pattern on a first surface, the mold being transparent;
    a mold chuck attached to the mold with a first surface for holding the mold and for compressing the mold against the resist of the substrate, the mold chuck having a penetration hole;
    a transparent plate attached to a second surface of the mold chuck forming a closed space with the penetration hole of the mold chuck and the mold;
    a fluid injector for injecting fluid in the closed space based on a compression state of the mold against the resist to reduce a deformation of the mold when the mold is compressed against the resist;
    an optical system for irradiating onto the mold a first light having a wavelength that does not expose the resist through the mold chuck;
    an image-pickup system for receiving a reflected light of the first light irradiated onto the mold; and
    a controller for controlling a supply amount of the fluid from the fluid injector on the basis of information regarding the compression state which is outputted from the image-pickup system,
    wherein a second light from a UV light source is configured to be transmitted through the transparent plate, the opening of the mold chuck, and the mold to reach the relief pattern and the surface of the resist on the substrate thereby curing the resist.

2. A processing apparatus according to claim 1, wherein the fluid is gas.

3. A processing apparatus according to claim 1, wherein each of the mold and the transparent plate has an alignment mark, wherein the processing apparatus further includes an alignment mechanism for moving the mold or transparent plate for an alignment between the alignment marks of the mold and the transparent plate.

4. A processing apparatus according to claim 1, wherein the mold chuck is made of a light transmitting material, and joined with at least part of an area on the mold, the second light being irradiated onto the area on the mold.

5. A processing apparatus according to claim 1, further comprising:
    a vacuum attraction part for vacuum-attracting the mold and the mold chuck to each other.

6. A processing apparatus according to claim 1, wherein each of the mold and the mold chuck has an alignment mark, wherein the processing apparatus further includes an alignment mechanism for moving the mold or the mold chuck for an alignment between the alignment marks of the mold and the mold chuck.

7. A processing apparatus according to claim 6, wherein an interferometer detects the alignment mark.

8. A device manufacturing method comprising the steps of:
    transferring a pattern onto resist on a substrate by using a processing apparatus according to claim 1; and
    etching the substrate.

* * * * *